United States Patent
Molina et al.

(10) Patent No.: US 12,028,090 B2
(45) Date of Patent: Jul. 2, 2024

(54) DIGITAL-TO-ANALOG CONVERTER, DIGITAL-TO-ANALOG CONVERSION SYSTEM, ELECTRONIC SYSTEM, BASE STATION AND MOBILE DEVICE

(71) Applicant: Intel Corporation, Santa Clara, CA (US)

(72) Inventors: Albert Molina, Novelda (ES); Kameran Azadet, San Ramon, CA (US); Martin Clara, Santa Clara, CA (US); Hundo Shin, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 82 days.

(21) Appl. No.: 17/754,310

(22) PCT Filed: Dec. 23, 2019

(86) PCT No.: PCT/US2019/068245
§ 371 (c)(1),
(2) Date: Mar. 30, 2022

(87) PCT Pub. No.: WO2021/133373
PCT Pub. Date: Jul. 1, 2021

(65) Prior Publication Data
US 2022/0345148 A1 Oct. 27, 2022

(51) Int. Cl.
*H03M 1/66* (2006.01)
*H03M 1/80* (2006.01)

(52) U.S. Cl.
CPC ................... *H03M 1/808* (2013.01)

(58) Field of Classification Search
CPC ...... H03M 1/808; H03M 1/747; H03M 1/806; H03M 1/0626; H03M 1/662; H03H 15/00
(Continued)

(56) References Cited

U.S. PATENT DOCUMENTS 8,860,597 B2    10/2014  Sienko
9,543,974 B1     1/2017  Yang
(Continued)

OTHER PUBLICATIONS

F. T. Gebreyohannes et al., "A configurable transmitter architecture for ieee 802.11 ac and 802.11 ad standards", IEEE Transactions on Circuits and Systems II: Express Briefs, vol. 63, No. 1, pp. 9-13, 2016.
(Continued)

*Primary Examiner* — Jean B Jeanglaude
(74) *Attorney, Agent, or Firm* — 2SPL Patent Attorneys PartG mbB; Yong Beom Hwang

(57) ABSTRACT

A digital-to-analog converter is provided. The digital-to-analog converter includes a delay circuit configured to iteratively delay a digital input signal based on a clock signal for generating a plurality of delayed digital input signals. Further, the digital-to-analog converter includes a plurality of groups of inverter cells. Each group of inverter cells is configured to generate a respective analog signal based on one of the plurality of delayed digital input signals. The inverter cells includes a respective inverter circuit configured to invert the respective delayed digital input signal. The plurality of groups of inverter cells include different numbers of inverter cells. The digital-to-analog converter additionally includes an output configured to output an analog output signal based on the analog signals of the plurality of groups of inverter cells.

18 Claims, 5 Drawing Sheets

(58) Field of Classification Search
USPC .......................................................... 341/144
See application file for complete search history.

(56) References Cited

U.S. PATENT DOCUMENTS

| | | |
|---|---|---|
| 9,762,256 B2 * | 9/2017 | Chandra ............... H03M 1/066 |
| 9,966,969 B1 * | 5/2018 | Engel .................... H03M 1/662 |
| 10,298,257 B1 * | 5/2019 | Braswell ............... H03M 3/464 |
| 2009/0195425 A1 | 8/2009 | Eloranta et al. |
| 2010/0097253 A1 | 4/2010 | Mu |
| 2011/0175764 A1 | 7/2011 | Booth et al. |

OTHER PUBLICATIONS

R.-C. Marin et al., "Digital RF transmitter with single-bit ΔΣ M-driven switched-capacitor RF DAC and embedded band filter in 28-nm FD-SOI", IEEE Transactions on Microwave Theory and Techniques, vol. 67, No. 7, pp. 3200-3209, 2019.

M. Reza Sadeghifar et al., "Direct digital-to-RF converter employing semi-digital FIR voltage-mode RF DAC", Integration, the VLSI Journal, vol. 66, No. C, pp. 128-134, 2019.

* cited by examiner

DIGITAL-TO-ANALOG CONVERTER, DIGITAL-TO-ANALOG CONVERSION SYSTEM, ELECTRONIC SYSTEM, BASE STATION AND MOBILE DEVICE

FIELD

The present disclosure relates to digital-to-analog conversion. In particular, examples relate to a Digital-to-Analog Converter (DAC), a digital-to-analog conversion system, an electronic system, a base station and a mobile device.

BACKGROUND

Many applications require an analog wideband calibration signal exhibiting high linearity and high out-of-band rejection.

Hence, there may be a desire for a signal generation circuit.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Same or like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled via one or more intervening elements. If two elements A and B are combined using an "or", this is to be understood to disclose all possible combinations, i.e. only A, only B as well as A and B, if not explicitly or implicitly defined otherwise. An alternative wording for the same combinations is "at least one of A and B" or "A and/or B". The same applies, mutatis mutandis, for combinations of more than two Elements.

The terminology used herein for the purpose of describing particular examples is not intended to be limiting for further examples. Whenever a singular form such as "a", "an" and "the" is used and using only a single element is neither explicitly nor implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises", "comprising", "includes" and/or "including", when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
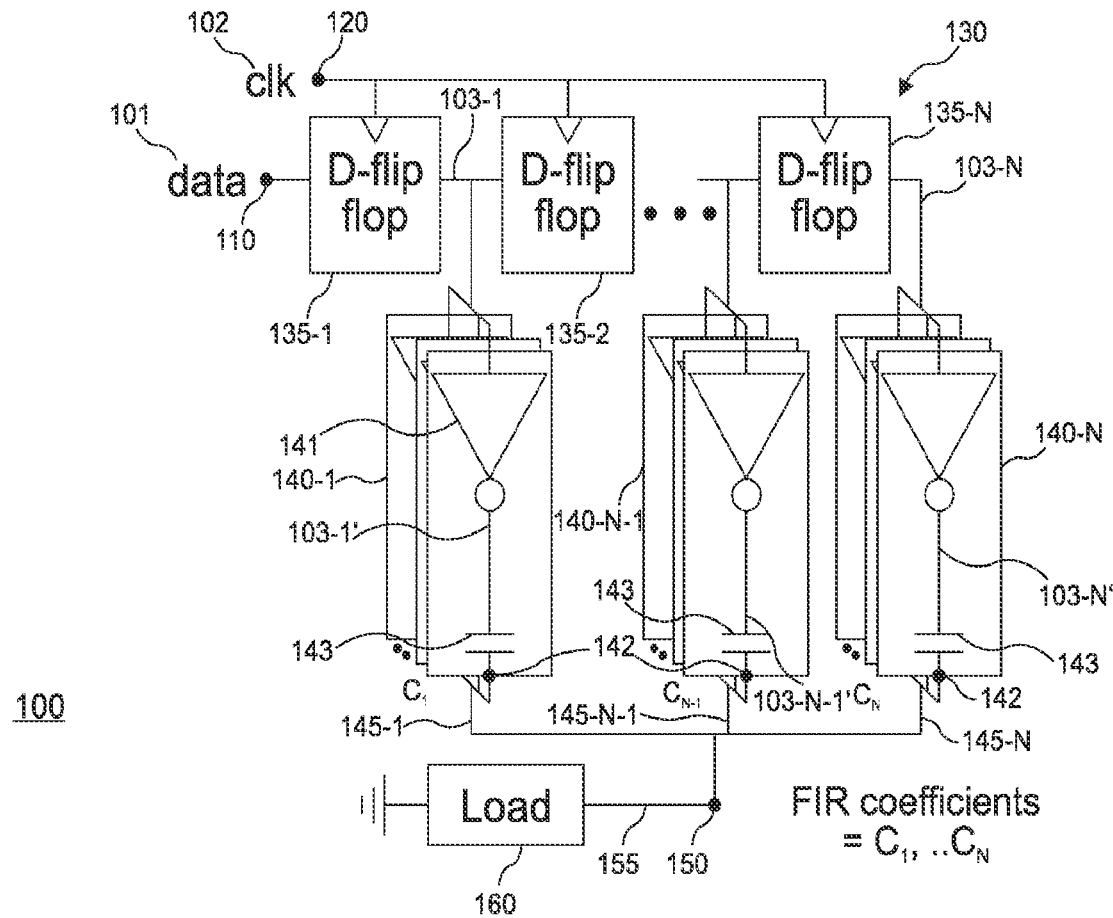
FIG. 1 illustrates a first example of a DAC.

FIG. 1 illustrates an example of a DAC 100. The DAC 100 comprises a first input (node) 110 for receiving a digital input signal 101, and a second input (node) 120 for receiving a clock signal 102. Further, the DAC 100 comprises delay circuit 130 configured to iteratively delay the digital input signal 101 based on the clock signal 102 for generating a plurality of delayed digital input signals 103-1, . . . , 103-N. The delay circuit 130 comprises a plurality of delay elements (circuits) 135-1, . . . , 135-N (e.g. flip-flop circuits as indicated in FIG. 1) configured to iteratively delay the digital input signal 101 based on the clock signal 102. The plurality of delay elements 135-1, . . . , 135-N may be any number $N \geq 2$ of delay elements.

The DAC 100 additionally comprises a plurality of groups of inverter cells 140-1, . . . , 140-N. Each group of the plurality of groups of inverter cells 140-1, . . . , 140-N is configured to generate a respective analog signal 145-1, . . . , 145-N based on one of the plurality of delayed digital input signals 103-1, . . . , 103-N. For example, the first group of inverter cells 140-1 generates a first analog signal 145-1 based on the first delayed digital input signal 103-1, whereas the N-th group of inverter cells 140-N generates an N-th analog signal 145-N based on the N-th delayed digital input signal 103-N.

The plurality of groups of inverter cells 140-1, . . . , 140-N comprise different numbers of inverter cells. For example, the first group of inverter cells 140-1 may comprises K inverter cells, whereas the N-th group of inverter cells 140-N comprises L K inverter cells.

Each of the inverter cells comprises a respective inverter circuit 141 configured to invert the respective delayed digital input signal 103-1, . . . , 103-N. For example, the inverter circuits 141 of the first group of inverter cells 140-1 respectively invert the first delayed digital input signal 103-1, whereas the inverter circuits 141 of the N-th group of inverter cells 140-N respectively invert the N-th delayed digital input signal 103-N.

The DAC 100 comprises an output (node) 150 configured to output an analog output signal 155 based on the analog signals 145-1, . . . , 145-N of the plurality of groups of inverter cells 140-1, . . . , 140-N. For example, the analog signals 145-1, . . . , 145-N of the plurality of groups of inverter cells 140-1, . . . , 140-N may be combined (summed) in order to obtain the analog output signal 155.

The plurality of groups of inverter cells 140-1, . . . , 140-N form a Finite Impulse Response (FIR) filter of the DAC 100. By selecting different numbers of inverter cells for each of the plurality of groups of inverter cells 140-1, . . . , 140-N, i.e. for each delay stage, different filter coefficients $C_1, \ldots, C_N$ of the FIR filter may be implemented. In other words, the numbers of inverter cells of the plurality of groups of inverter cells 140-1, . . . , 140-N may be selected based on desired/target filter coefficients $C_1, \ldots, C_N$ of the FIR filter. The FIR filter of the DAC 100 allows to provide the analog output signal 155 with high spectral purity.

The DAC 100 is simple in structure since it is inverter-based. Therefore, the DAC 100 is capable of high-speed operation. Further, since the structure of the DAC 100 is based on digital circuitry, the DAC performance may increase when implemented in deeper sub-micron technology unlike conventional analog structures.

The DAC 100 may, e.g., be a 1-bit DAC. When implemented as 1-bit DAC, the analog output signal 155 is inherently linear. Hence, an inherently linear analog output signal 155 with high spectral purity may be provided by the DAC 100. Such a signal is suitable for use as calibration signal (e.g. for a load 160 such as an Analog-to-Digital Converter, ADC).

In the example of FIG. 1, the DAC 100 is an analog FIR DAC based on capacitive inverters in order to block DC current. As can be seen from FIG. 1, each of the inverter cells comprises a cell output (node) 142 and a capacitive element 143. The capacitive element 143 is configured to supply a respective analog cell output signal to the cell output 142 based on the inverted delayed digital input signal 103-1', ..., 103-N' output by the inverter circuit 141 of the respective inverter cell.

However, the proposed architecture is not limited to the inverter cell structure illustrated in FIG. 1. Two alternative inverter cell structures are illustrated in FIGS. 2 and 3.

Figure 2:
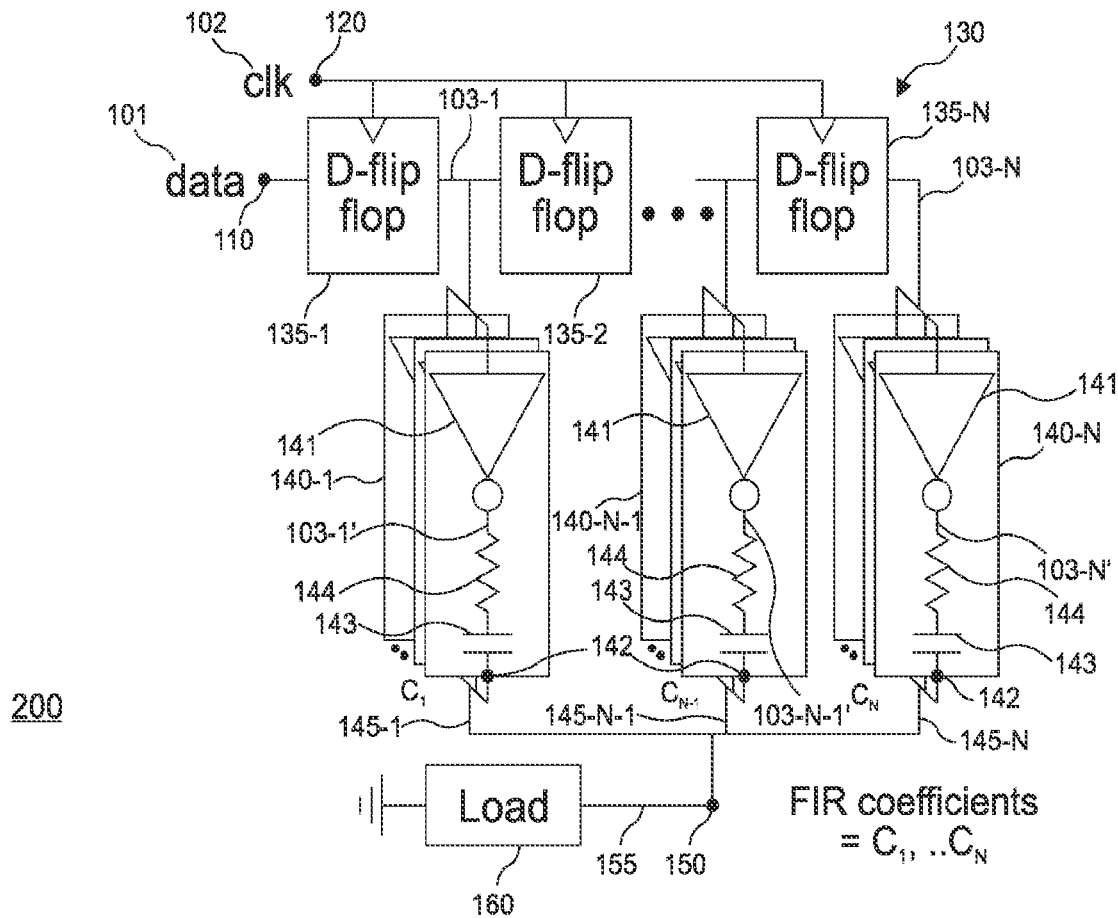
FIG. 2 illustrates a second example of a DAC.

FIG. 2 illustrates an analog FIR DAC 200 based on capacitive inverters with passive linearization. Compared to the DAC 100 illustrated in FIG. 1, the inverter cells of the plurality of groups of inverter cells 140-1, ..., 140-N of the DAC 200 additionally comprise a resistive element 144 coupled between the respective inverter circuit 141 and the respective capacitive element 143. The additional resistive element 144 may allow to reduce signal dependent resistance variations (i.e. resistance variations caused by the digital input signal 101).

Figure 3:
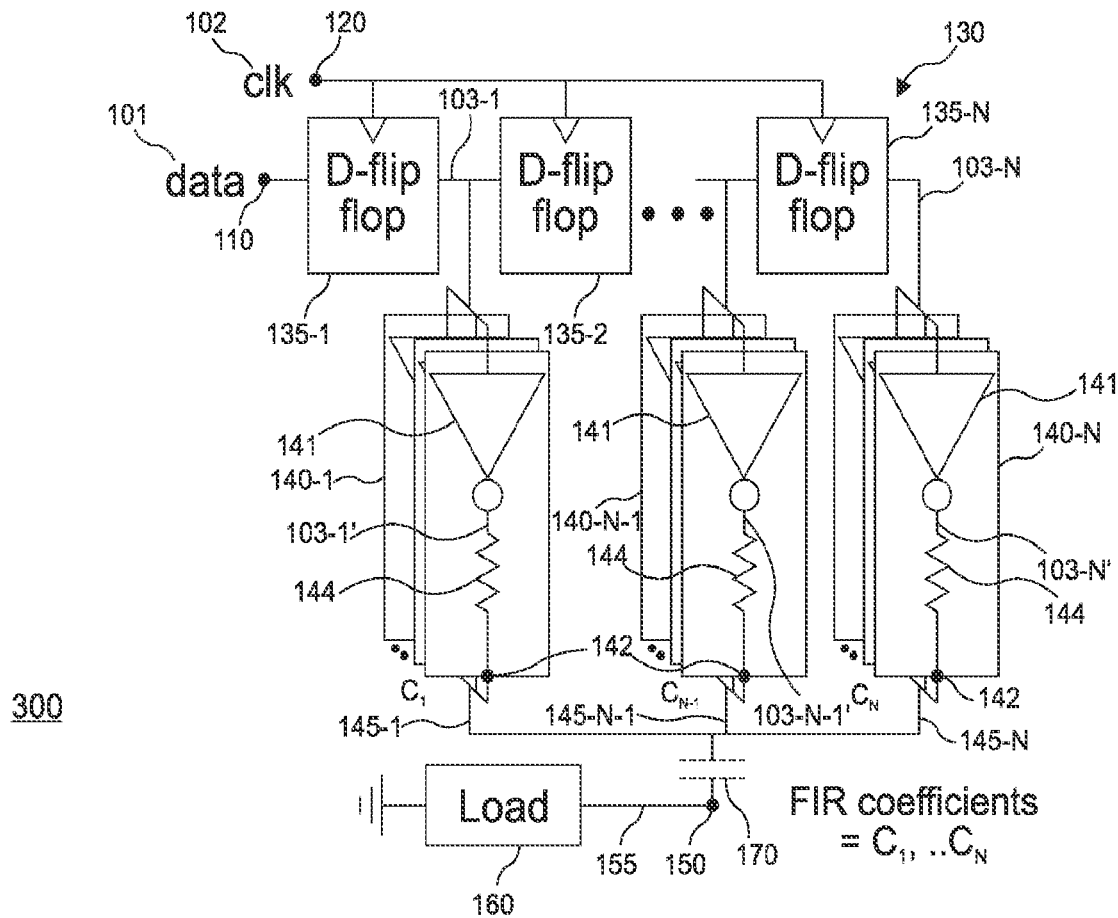
FIG. 3 illustrates a third example of a DAC.

FIG. 3 illustrates an analog FIR DAC 300 based on resistive inverters in order to remove the zero at DC. In contrast to the DAC 200, the inverter cells of the plurality of groups of inverter cells 140-1, ..., 140-N of the DAC 300 omit (i.e. do not comprise) the capacitive element. In other words, the resistive element 144 is configured to supply the analog cell output signal to the cell output 142 based on the inverted delayed digital input signal 103-1', ..., 103-N' output by the inverter circuit 141 of the respective inverter cell.

As indicated in FIG. 3, the DAC 300 may optionally further comprise a capacitive element 170 coupled between the plurality of groups of inverter cells 140-1, ..., 140-N and the output 150. The capacitive element 170 is configured to generate the analog output signal 155 based on the analog signals 145-1, ..., 145-N of the plurality of groups of inverter cells 140-1, ..., 140-N. Using the single capacitive element 170 outside the inverter cells instead of a respective capacitive element 143 inside each of the inverter cells (as shown in FIGS. 2 and 3) may allow to improve the quality of the analog output signal 155. This is because the single capacitive element 170 has less stray capacitance while the respective capacitive element 143 inside each of the inverter cells 140-1, ..., 140-N may have coupling stray capacitance between each element.

Figure 4:
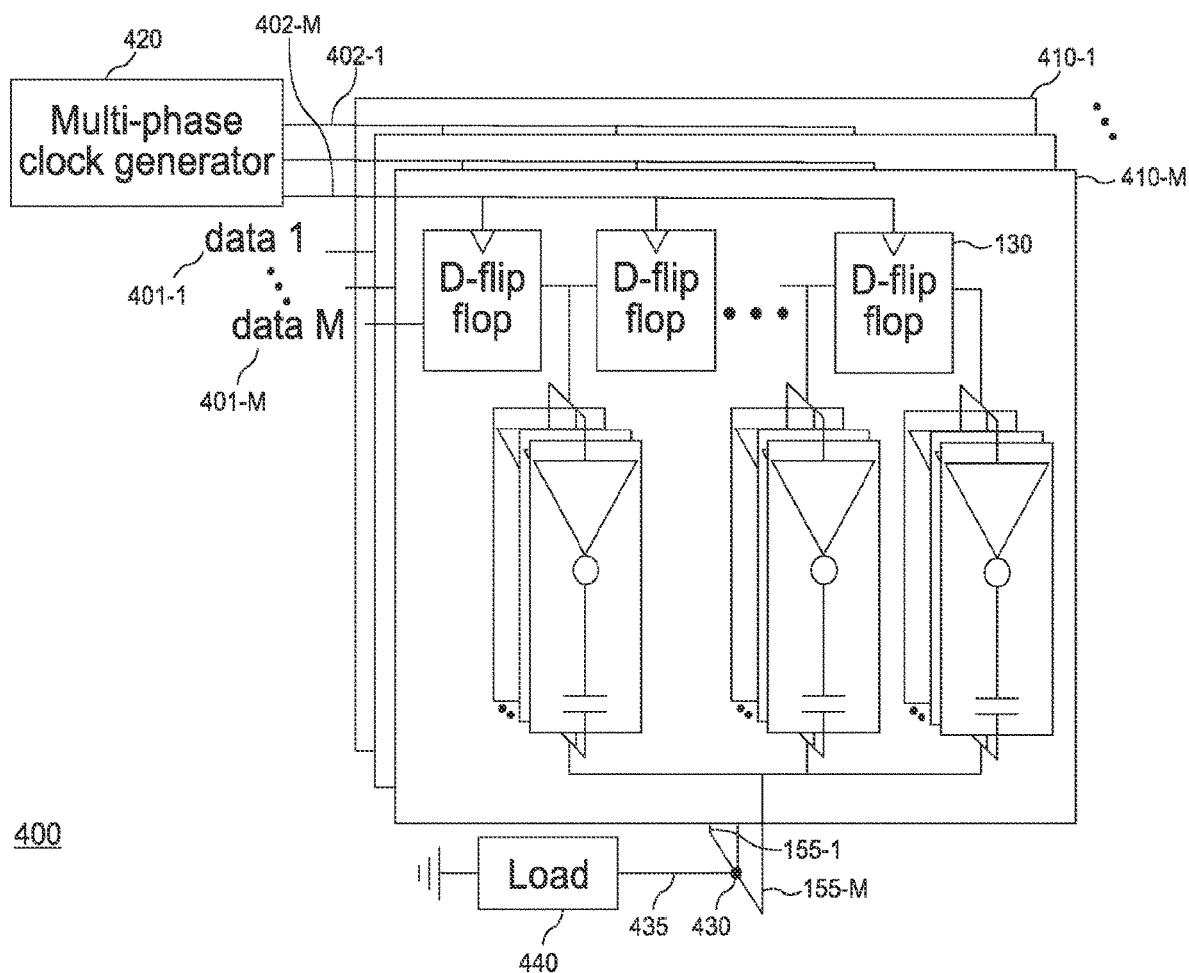
FIG. 4 illustrates an example of a digital-to-analog conversion system.

FIG. 4 illustrates a digital-to-analog conversion system 400 using a plurality of the proposed DACs 410-1, ..., 410-M (with M≥2) for converting a respective digital input signal 401-1, ..., 401-M into an analog signal.

The digital-to-analog conversion system 400 further comprises a clock generator circuit 420 configured to output a plurality of phase-shifted clock signals 402-1, ..., 402-M.

The respective delay circuit of each of the plurality of DACs 410-1, ..., 410-M is configured to iteratively delay the respective digital input signal 401-1, ..., 401-M based on a different one of the plurality of phase-shifted clock signals 402-1, ..., 402-M. This is exemplarily illustrated for the M-th DAC 410-M. The delay circuit 130 of the M-th DAC 410-M iteratively delays the digital input signal 401-M based on the clock signal 402-M provided by the clock generator circuit 420.

A system output (node) 430 of the digital-to-analog conversion system 400 is configured to output a combined analog output signal 435 based on the analog output signals 155-1, ..., 155-M of the plurality of DACs 410-1, ..., 410-M. A load 440 may be coupled to the system output 430 for receiving the combined analog output signal 435.

The digital input signals 401-1, ..., 401-M may be identical or different from each other. Hence, the delay circuits of the plurality of DACs 410-1, ..., 410-M may in some examples be configured to iteratively delay the same digital input signal. The digital input signal is then effectively sampled M times based on the M phase-shifted clock signals 402-1, ..., 402-M such that the effective (virtual) sampling rate of the digital-to-analog conversion system 400 is M times the sampling rate of the individual DAC. Hence, the digital-to-analog conversion system 400 may enable high-speed sampling.

Figure 5:
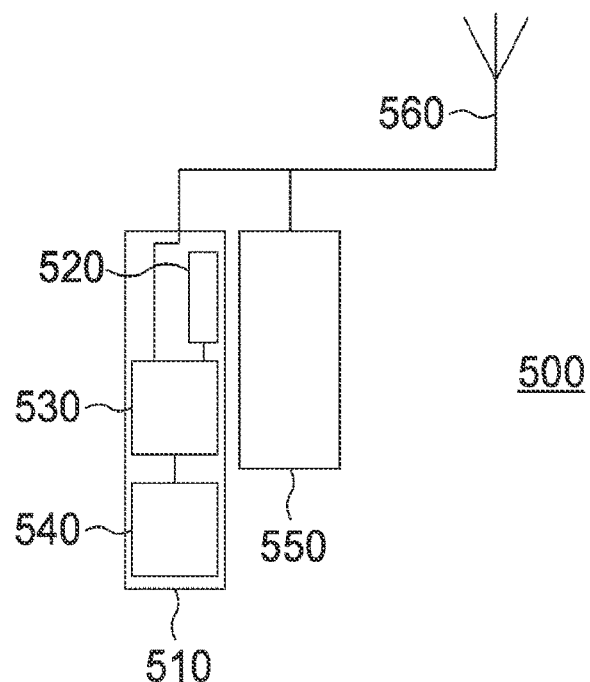
FIG. 5 illustrates an example of a base station.

An example of an implementation using a DAC according to one or more aspects of the architecture described above in connection with FIGS. 1 to 4 or one or more examples described above in connection with FIGS. 1 to 4 is illustrated in FIG. 5. FIG. 5 schematically illustrates an example of a radio base station 500 (e.g. for a femtocell, a picocell, a microcell or a macrocell) comprising a DAC 520 as proposed.

The DAC 520 is part of a receiver 510 (being an example for an electronic system). The receiver 510 additionally comprises an ADC 530 coupled to the DAC 520. The ADC 530 is configured to generate digital output data based on the analog output signal of the DAC 520. The digital input signal for the DAC 520 is a digital calibration signal such that the analog output signal of the DAC 520 is analog calibration signal (e.g. a sinusoidal signal). Further, the receiver 510 comprises calibration circuitry 540 configured to generate calibration data for the ADC 530 based on the digital output data. Accordingly, the DAC 520 may allow to calibrate the ADC 530.

The DAC 520, the ADC 530 and the calibration circuitry 540 may, e.g., be implemented in the same semiconductor chip.

In some examples, the radio base station 500 may comprise more than one DAC 520. For example, the plural DACs may be combined to the digital-to-analog conversion system described above. In other words, the radio base station 500 may comprise the above described digital-to-analog conversion system instead of the single DAC 520.

The receiver 510 is coupled to an antenna element 560 of the base station 500 (either directly or indirectly via one or more intermediate elements such as a filter or a Low Noise Amplifier, LNA). The ADC 530 is coupled to the antenna element 560 for digitizing a radio frequency receive signal received by the antenna element 560.

Further, the base station 500 comprises a transmitter 550 configured to generate a radio frequency transmit signal. The transmitter 550 may use the antenna element 560 or another antenna element (not illustrated) of the base station 500 for radiating the radio frequency transmit signal to the environment.

To this end, a base station with a DAC for generating calibration signals of high quality may be provided.

The base station 500 may comprise further elements such as, e.g., a baseband processor, an application processor, memory, a network controller, a user interface, power management circuitry, a satellite navigation receiver, a network interface controller or power tee circuitry.

In some aspects, the application processor may include one or more Central Processing Unit CPU cores and one or more of cache memory, a Low-DropOut (LDO) voltage regulator, interrupt controllers, serial interfaces such as Serial Peripheral Interface (SPI), Inter-Integrated Circuit ($I^2C$) or universal programmable serial interface module, Real Time Clock (RTC), timer-counters including interval and watchdog timers, general purpose Input-Output (IO), memory card controllers such as Secure Digital (SD)/MultiMedia Card (MMC) or similar, Universal Serial Bus (USB) interfaces, Mobile Industry Processor Interface Alliance (MIPI) interfaces and Joint Test Access Group (JTAG) test access ports.

In some aspects, the baseband processor may be implemented, for example, as a solder-down substrate including one or more integrated circuits, a single packaged integrated circuit soldered to a main circuit board or a multi-chip module containing two or more integrated circuits.

In some aspects, the memory may include one or more of volatile memory including Dynamic Random Access Memory (DRAM) and/or Synchronous Dynamic Random Access Memory (SDRAM), and Non-Volatile Memory (NVM) including high-speed electrically erasable memory (commonly referred to as Flash memory), Phase change Random Access Memory (PRAM), Magnetoresistive Random Access Memory (MRAM) and/or a three-dimensional crosspoint (3D XPoint) memory. The memory may be implemented as one or more of solder down packaged integrated circuits, socketed memory modules and plug-in memory cards.

In some aspects, the power management integrated circuitry may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, the power tee circuitry may provide for electrical power drawn from a network cable to provide both power supply and data connectivity to the base station using a single cable.

In some aspects, the network controller may provide connectivity to a network using a standard network interface protocol such as Ethernet. Network connectivity may be provided using a physical connection which is one of electrical (commonly referred to as copper interconnect), optical or wireless.

In some aspects, the satellite navigation receiver module may include circuitry to receive and decode signals transmitted by one or more navigation satellite constellations such as the Global Positioning System (GPS), GLObalnaya NAvigatSionnaya Sputnikovaya Sistema (GLONASS), Galileo and/or BeiDou. The receiver may provide data to the application processor which may include one or more of position data or time data. The application processor may use time data to synchronize operations with other radio base stations.

In some aspects, the user interface may include one or more of physical or virtual buttons, such as a reset button, one or more indicators such as Light Emitting Diodes (LEDs) and a display screen.

Figure 6:
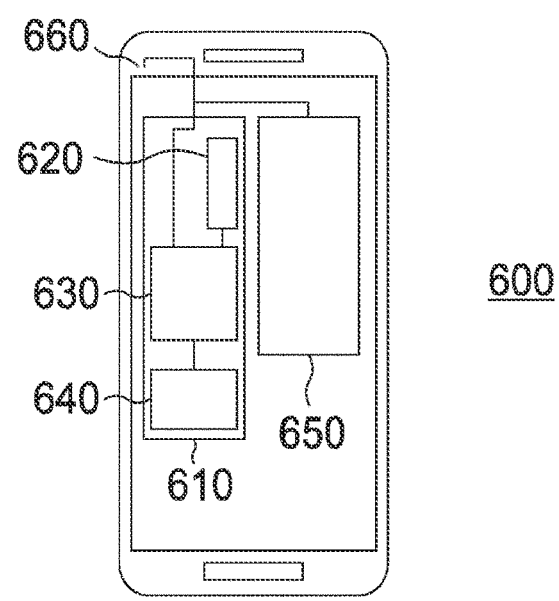
FIG. 6 illustrates an example of a mobile device.

Another example of an implementation using a DAC according to one or more aspects of the architecture described above in connection with FIGS. 1 to 4 or one or more examples described above in connection with FIGS. 1 to 4 is illustrated in FIG. 6. FIG. 6 schematically illustrates an example of a mobile device 600 (e.g. mobile phone, smartphone, tablet-computer, or laptop) comprising a DAC 620 as proposed.

The DAC 620 is part of a receiver 610. The receiver 610 additionally comprises an ADC 630 coupled to the DAC 620. The ADC 630 is configured to generate digital output data based on the analog output signal of the DAC 620. The digital input signal for the DAC 620 is a digital calibration signal such that the analog output signal of the DAC 620 is analog calibration signal (e.g. a sinusoidal signal). Further, the receiver 610 comprises calibration circuitry 640 configured to generate calibration data for the ADC 630 based on the digital output data. Accordingly, the DAC 620 may allow to calibrate the ADC 630.

The DAC 620, the ADC 630 and the calibration circuitry 640 may, e.g., be implemented in the same semiconductor chip.

In some examples, the mobile device 600 may comprise more than one DAC 620. For example, the plural DACs may be combined to the digital-to-analog conversion system described above. In other words, the mobile device 600 may comprise the above described digital-to-analog conversion system instead of the single DAC 620.

The receiver 610 is coupled to an antenna element 660 of the mobile device 600 (either directly or indirectly via one or more intermediate elements such as a filter or an LNA). The ADC 630 is coupled to the antenna element 660 for digitizing a radio frequency receive signal received by the antenna element 660.

Further, the mobile device 600 comprises a transmitter 650 configured to generate a radio frequency transmit signal. The transmitter 650 may use the antenna element 660 or another antenna element (not illustrated) of the mobile device 600 for radiating the radio frequency transmit signal to the environment.

To this end, a mobile device with a DAC for generating calibration signals of high quality may be provided.

The mobile device 600 may comprise further elements such as, e.g., a baseband processor, memory, a connectivity module, a Near Field Communication (NFC) controller, an audio driver, a camera driver, a touch screen, a display driver, sensors, removable memory, a power management integrated circuit or a smart battery.

In some aspects, the application processor may include, for example, one or more CPU cores and one or more of cache memory, LDO regulators, interrupt controllers, serial interfaces such as SPI, $I^2C$ or universal programmable serial interface module, RTC, timer-counters including interval and watchdog timers, general purpose input-output (TO), memory card controllers such as SD/MMC or similar, USB interfaces, MIPI interfaces and JTAG test access ports.

In some aspects, the baseband module may be implemented, for example, as a solder-down substrate including one or more integrated circuits, a single packaged integrated circuit soldered to a main circuit board, and/or a multi-chip module containing two or more integrated circuits.

The wireless communication circuits using a DAC according to the proposed architecture or one or more of the examples described above may be configured to operate according to one of the 3GPP-standardized mobile communication networks or systems. The mobile or wireless communication system may correspond to, for example, a 5G NR, a Long-Term Evolution (LTE), an LTE-Advanced (LTE-A), High Speed Packet Access (HSPA), a Universal Mobile Telecommunication System (UMTS) or a UMTS Terrestrial Radio Access Network (UTRAN), an evolved-UTRAN (e-UTRAN), a Global System for Mobile communication (GSM), an Enhanced Data rates for GSM Evolution (EDGE) network, or a GSM/EDGE Radio Access Network (GERAN). Alternatively, the wireless communication circuits may be configured to operate according to mobile communication networks with different standards, for example, a Worldwide Inter-operability for Microwave Access (WIMAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc.

The examples described herein may be summarized as follows:

Example 1 is a DAC, comprising: a delay circuit configured to iteratively delay a digital input signal based on a clock signal for generating a plurality of delayed digital input signals; a plurality of groups of inverter cells, wherein each group of inverter cells is configured to generate a respective analog signal based on one of the plurality of delayed digital input signals, wherein the inverter cells comprise a respective inverter circuit configured to invert the respective delayed digital input signal, and wherein the plurality of groups of inverter cells comprise different numbers of inverter cells; and an output configured to output an analog output signal based on the analog signals of the plurality of groups of inverter cells.

Example 2 is the DAC of example 1, wherein at least one of the inverter cells comprises: a cell output; and a capacitive element configured to supply an analog cell output signal to the cell output based on the inverted delayed digital input signal output by the inverter circuit of the at least one of the inverter cells.

Example 3 is the DAC of example 2, wherein the at least one of the inverter cells further comprises: a resistive element coupled between the inverter circuit and the capacitive element.

Example 4 is the DAC of example 1, wherein at least one of the inverter cells comprises: a cell output; and a resistive element configured to supply an analog cell output signal to the cell output based on the inverted delayed digital input signal output by the inverter circuit of the at least one of the inverter cells.

Example 5 is the DAC of example 4, further comprising: a capacitive element coupled between the plurality of groups of inverter cells and the output, wherein the capacitive element is configured to generate the analog output signal based on the analog signals of the plurality of groups of inverter cells.

Example 6 is the DAC of any of examples 1 to 5, wherein the plurality of groups of inverter cells form a FIR filter, and wherein the numbers of inverter cells of the plurality of groups of inverter cells are selected based on desired filter coefficients of the FIR filter.

Example 7 is the DAC of any of examples 1 to 6, wherein the delay circuit comprises a plurality of delay elements configured to iteratively delay the digital input signal based on the clock signal.

Example 8 is the DAC of example 7, wherein the delay elements are flip-flop circuits.

Example 9 is the DAC of any of examples 1 to 8, wherein the DAC is a 1 bit DAC.

Example 10 is a digital-to-analog conversion system, comprising: a plurality of DACs according to any of examples 1 to 9; and a clock generator circuit configured to output a plurality of phase-shifted clock signals, wherein the respective delay circuit of each of the plurality of DACs is configured to iteratively delay a respective digital input signal based on a different one of the plurality of phase-shifted clock signals.

Example 11 is the digital-to-analog conversion system of example 10, further comprising: a system output configured to output a combined analog output signal based on the analog output signals of the plurality of DACs.

Example 12 is the digital-to-analog conversion system example 10 or example 11, wherein the delay circuits of the plurality of DACs are configured to iteratively delay the same digital input signal.

Example 13 is an electronic system, comprising: at least one DAC according to any of examples 1 to 9, wherein the digital input signal is a digital calibration signal; an ADC coupled to the at least one DAC and configured to generate digital output data based on the analog output signal of the at least one DAC; and calibration circuitry configured to generate calibration data for the ADC based on the digital output data.

Example 14 is the electronic system of example 13, wherein the at least one DAC, the ADC and the calibration circuitry are implemented in the same semiconductor chip.

Example 15 is a base station, comprising: an electronic system according to example 13 or example 14, wherein the ADC is part of a receiver; and at least one antenna element coupled to the receiver.

Example 16 is the base station of example 15, further comprising a transmitter configured to supply a radio frequency transmit signal to the antenna element for radiation to the environment.

Example 17 is a mobile device, comprising: an electronic system according to example 13 or example 14, wherein the ADC is part of a receiver; and at least one antenna element coupled to the receiver.

Example 18 is the mobile device of example 17, further comprising a transmitter configured to supply a radio frequency transmit signal to the antenna element for radiation to the environment.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a signal", "means for generating a signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and nonvolatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A digital-to-analog converter, comprising:
   a delay circuit configured to iteratively delay a digital input signal based on a clock signal for generating a plurality of delayed digital input signals;
   a plurality of groups of inverter cells, wherein each group of inverter cells is configured to generate a respective analog signal based on one of the plurality of delayed digital input signals, wherein the inverter cells comprise a respective inverter circuit configured to invert the respective delayed digital input signal, and wherein the plurality of groups of inverter cells comprise different numbers of inverter cells; and
   an output configured to output an analog output signal based on the analog signals of the plurality of groups of inverter cells.

2. The digital-to-analog converter of claim 1, wherein at least one of the inverter cells comprises:
   a cell output; and
   a capacitive element configured to supply an analog cell output signal to the cell output based on the inverted delayed digital input signal output by the inverter circuit of the at least one of the inverter cells.

3. The digital-to-analog converter of claim 2, wherein the at least one of the inverter cells further comprises:
   a resistive element coupled between the inverter circuit and the capacitive element.

4. The digital-to-analog converter of claim 1, wherein at least one of the inverter cells comprises:
   a cell output; and
   a resistive element configured to supply an analog cell output signal to the cell output based on the inverted delayed digital input signal output by the inverter circuit of the at least one of the inverter cells.

5. The digital-to-analog converter of claim 4, further comprising:
   a capacitive element coupled between the plurality of groups of inverter cells and the output, wherein the capacitive element is configured to generate the analog output signal based on the analog signals of the plurality of groups of inverter cells.

6. The digital-to-analog converter of claim 1, wherein the plurality of groups of inverter cells form a finite impulse response filter, and wherein the numbers of inverter cells of the plurality of groups of inverter cells are selected based on desired filter coefficients of the finite impulse response filter.

7. The digital-to-analog converter of claim 1, wherein the delay circuit comprises a plurality of delay elements configured to iteratively delay the digital input signal based on the clock signal.

8. The digital-to-analog converter of claim 7, wherein the delay elements are flip-flop circuits.

9. The digital-to-analog converter of claim 1, wherein the digital-to-analog converter is a 1 bit digital-to-analog converter.

10. A digital-to-analog conversion system, comprising:
a plurality of digital-to-analog converters according to claim 1; and
a clock generator circuit configured to output a plurality of phase-shifted clock signals, wherein the respective delay circuit of each of the plurality of digital-to-analog converters is configured to iteratively delay a respective digital input signal based on a different one of the plurality of phase-shifted clock signals.

11. The digital-to-analog conversion system of claim 10, further comprising:
a system output configured to output a combined analog output signal based on the analog output signals of the plurality of digital-to-analog converters.

12. The digital-to-analog conversion system claim 10, wherein the delay circuits of the plurality of digital-to-analog converters are configured to iteratively delay the same digital input signal.

13. An electronic system, comprising:
at least one digital-to-analog converter according to claim 1, wherein the digital input signal is a digital calibration signal;
an analog-to-digital converter coupled to the at least one digital-to-analog converter and configured to generate digital output data based on the analog output signal of the at least one digital-to-analog converter; and
calibration circuitry configured to generate calibration data for the analog-to-digital converter based on the digital output data.

14. The electronic system of claim 13, wherein the at least one digital-to-analog converter, the analog-to-digital converter and the calibration circuitry are implemented in the same semiconductor chip.

15. A base station, comprising:
an electronic system according to claim 13, wherein the analog-to-digital converter is part of a receiver; and
at least one antenna element coupled to the receiver.

16. The base station of claim 15, further comprising a transmitter configured to supply a radio frequency transmit signal to the antenna element for radiation to the environment.

17. A mobile device, comprising:
an electronic system according to claim 13, wherein the analog-to-digital converter is part of a receiver; and
at least one antenna element coupled to the receiver.

18. The mobile device of claim 17, further comprising a transmitter configured to supply a radio frequency transmit signal to the antenna element for radiation to the environment.

* * * * *